United States Patent

Tamura et al.

[11] Patent Number: 4,631,448
[45] Date of Patent: Dec. 23, 1986

[54] ION SOURCE

[75] Inventors: Hifumi Tamura, Hachioji, Japan; Clay Shepherd, Los Altos, Calif.; Toru Ishitani, Sayama; Kaoru Umemura, Kokubunji, both of Japan

[73] Assignee: Hitachi, Ltd., Tokyo, Japan

[21] Appl. No.: 578,206

[22] Filed: Feb. 8, 1984

[30] Foreign Application Priority Data

Mar. 9, 1983 [JP] Japan ................................. 58-37394

[51] Int. Cl.[4] ............................................. H01J 27/22
[52] U.S. Cl. ........................ 315/111.81; 315/111.91; 313/362.1; 313/363.1; 250/427
[58] Field of Search ..................... 315/111.81, 111.91; 313/363.1; 250/427; 313/362.1

[56] References Cited

U.S. PATENT DOCUMENTS 4,453,078 6/1984 Shimizu ..................... 315/111.81

FOREIGN PATENT DOCUMENTS 123453 9/1981 Japan .
0198822 11/1983 Japan ......................... 315/111.81
0198815 11/1983 Japan ......................... 315/111.81

Primary Examiner—David K. Moore
Assistant Examiner—M. Razavi
Attorney, Agent, or Firm—Antonelli, Terry & Wands

[57] ABSTRACT

An ion source is disclosed in which a crucible for holding an ion source material is provided with an aperture in its bottom wall, an emitter chip is disposed within the crucible in a coaxial manner so that the edge of the emitter chip passes through the aperture, a semi-closed crucible made of a conductive material and having the form of a circular cone is disposed in the vicinity of the tip of the emitter chip so as to be coaxial with the emitter chip and to have the same electric potential as the emitter chip, a filament for emitting an electron beam is disposed in the vicinity of the emitter chip, an ion extracting electrode is disposed at a place which is a little spaced apart from the tip of the emitter chip, and a lid is inserted into the ion source material holding part so as to be placed on the above-mentioned semi-closed crucible, thereby preventing the ion source material from being scattered by evaporation.

20 Claims, 3 Drawing Figures

ION SOURCE

BACKGROUND OF THE INVENTION

The present invention relates to an improvement in a field emission type or surface ionization type ion source suitable for use in an ion microbeam milling system and an ion microimplanter for fabricating ultra large scale integrated circuits, and in a microbeam analysis system.

FIGS. 1 and 2 show two examples of conventional ion sources. The ion source shown in FIG. 1 is mainly made up of an emitter chip 1 attached to the turning point of a hairpin filament 2 and having a sharp tip, an extraction electrode 4, and an ion accelerating/extracting power supply 6. The operation principle of this ion source is as follows. First, an ion source material 3 is supplied to the junction part of the hairpin filament 2 and the emitter chip 1. A current is forced to flow through the filament 2, to melt the ion source material 3 by Joule's heat. Thus, the ion source material 3 is supplied to the tip of the emitter chip 1 in a molten state. Next, a voltage is applied between the extraction electrode 4 and emitter chip 1 by means of the power supply 6, to draw out an ion beam 5 from the tip of the emitter chip 1 on the basis of the field emission or surface ionization.

The above ion source has the following drawbacks.

(1) The ion source material is heated by Joule heating, and therefore it is not possible to heat the ion source material to temperatures exceeding a limit.

(2) The molten ion source material 3 is supported by the emitter chip 1 and filament 2 in an open state, and therefore evaporates violently. Accordingly, surrounding members are greatly contaminated with the material 3, and moreover the useful life of the ion source is short.

(3) In the case where a chemical compound is used as the ion source material 3, the composition of the vapor of the ion source material 3 varies with time on the basis of a difference in vapor pressure between constituent elements, and therefore the intensity of an ion current varies with time.

(4) The amount of the ion source material 3 loaded in the ion source is determined only by the surface tension of the molten ion source material. Accordingly, a limited quantity of ion source material can be loaded in the ion source, and therefore the useful life of the ion source is short.

FIG. 2 shows a field emission type ion source recently developed by part of the present inventors (Japanese Utility Model Kokai (Laid-Open) No. Sho. 56-123453), which makes use of electron bombardment heating. The ion source shown in FIG. 2 includes an emitter chip 1, a lid 8 for preventing the evaporation loss of an ion source material 3, a crucible 7, a filament 2 for electron bombardment heating, a control electrode 9, an ion extracting electrode 4, a filament heating power supply 11, an electron accelerating power supply 10, and an ion accelerating power supply 6. The operation principle of this ion source is as follows. First, the ion source material 3 is loaded in the crucible 7. Then, the emitter chip 1 is heated by the electron beam from the filament 2, to melt the ion source material 3 on the basis of the thermal conduction from the emitter chip 1. Finally, an ion extracting voltage is applied between the emitter chip 1 and ion extracting electrode 4, to extract an ion beam 5.

The ion source shown in FIG. 2 is superior to the ion source shown in FIG. 1 and heated by a Joule heat, in that the ion of a material having a high melting point and the ion of a reactive material can be obtained, but still has the following drawbacks.

(1) In the case where a material having a high vapor pressure is used as the ion source material 3, the ion source material 3 evaporates too violently to make it difficult to supply the ion source material to the tip of the emitter chip 1.

(2) Since the ion source material 3 is heated from the outside with the irradiation of electron beam, it is difficult to heat the ion source material 3 uniformly. Accordingly, it is difficult to supply the ion source material 3 to the tip of the emitter chip 1.

(3) The ion source material 3 having a high vapor pressure readily evaporates, and flies off in various directions. Accordingly, it is very dangerous to use a noxious material as the ion source material.

(4) It is difficult to use a less reactive emitter chip which is made of an insulating material.

SUMMARY OF THE INVENTION

An object of the present invention is to provide an ion source capable of producing various ions safely and surely even from a material having a high melting point, a reactive material, a noxious material and an insulating material which are not fitted to be used as an ion source material in a conventional ion source.

In order to attain the above object, according to the present invention, there is provided an ion source comprising: an emitter chip having a sharp tip; an ion source material holding part made of a material having a high melting point and provided with an aperture in a bottom wall, the emitter chip being disposed within the ion source material holding part in a coaxial manner so that the tip of the emitter chip passes through the aperture; means for emitting an electron beam; a power supply for heating the electron beam emitting means; an extraction electrode adapted to form an electric field for extracting an ion, around the tip of the emitter chip; an ion extracting power supply for applying a high voltage between the extraction electrode and the emitter chip; and an ion source material reservoir made of a conductive material and provided in the vicinity of the tip of the emitter chip so as to have the same electric potential as the emitter chip.

The ion source crucible heated by an electron beam preferably has following functions: (1) to be easily heated, (2) to confine the heat, (3) to be hardly charged up, etc. These functions are hardly satisfied by the conventional single crucible, but can be achieved by the double structure crucible according to this invention. The outer crucible is made of a poor heat conductor, while the inner crucible is made of a good heat conductor and the contact therebetween is made in a limited area. This structure is effective to heat the ion source material uniformly and effectively, while preventing the excessive heat dissipation. The outer crucible may be insulative and disposed above the control electrode to prevent charge up and the inner electrode may have some electric conductivity and a good thermal conductivity. The inner crucible preferably has a converging cone shape while the shape of the outer crucible is not limited to a cone shape provided that it can support the inner crucible preferably at limited areas.

Electron beam heating may preferably be applied to the tip of the emitter chip but the practical technique heats the inner crucible. A thermally conductive inner crucible brings the inner crucible, the ion source material and the emitter chip at substantially the same temperature. Further, the molten ion source material brings the emitter chip and the inner crucible (when conductive) substantially at the same electric potential.

DESCRIPTION OF THE PREFERRED EMBODIMENT

Figure 1:
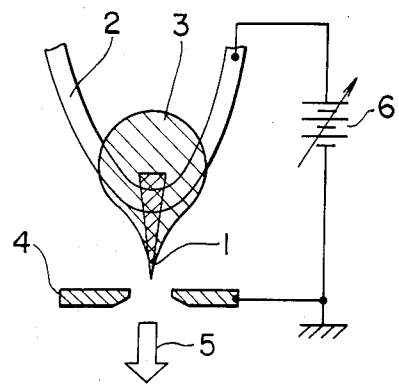
FIG. 1 is a sectional view showing a conventional ion source in which an emitter chip is attached to the turning point of a hairpin filament.
Figure 2:
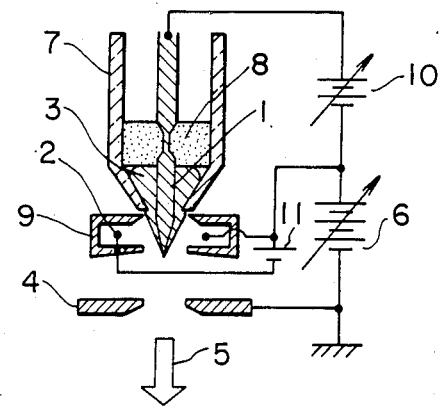
FIG. 2 is a sectional view showing another conventional ion source provided with means for electron bombardment heating.
Figure 3:
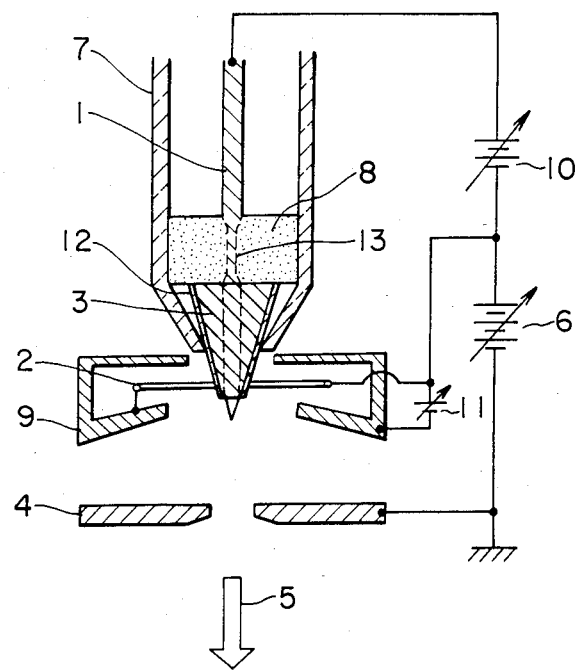
FIG. 3 is a sectional view showing an embodiment of an ion source according to the present invention.

The present invention will be explained below in detail, on the basis of an embodiment shown in FIG. 3. In FIG. 3, reference numeral 3 designates an ion source material, 1 an emitter chip, and 7 an outer crucible serving as an ion source material holding part. The crucible 7 may be made of an insulating material such as boron nitride (BN), quartz glass. The crucible 7 preferably has a heat insulative property. The emitter chip 1 having the form of a round bar and provided with a sharp tip is inserted into the crucible 7 so as to be coaxial with the crucible 7. The bottom wall of the crucible 7 has an aperture, through which the tip of the emitter chip 1 protrudes downwards from the bottom wall. The ion source material 3 is loaded in a bottom portion of the crucible 7 and around the tip of the emitter chip 1. The emitter chip 1 has a constricted part 13 to increase the heat resistance of the chip 1. Further, in FIG. 3, reference numeral 2 designates a filament for emitting an electron beam to bombard the tip of the emitter chip 1 with the electron beam, 11 a power supply for heating the filament 2, 4 an ion extracting electrode, 6 an ion accelerating power supply for accelerating an ion beam 5 extracted from the emitter chip 1, 10 an electron accelerating power supply for accelerating the electron beam emitted from the filament 2, 12 a semi-closed or inner crucible serving as an ion source material reservior, and 8 a lid placed in the inner crucible 12. The inner crucible 12 is disposed in the vicinity of the tip of the emitter chip 1 so as to be coaxial with the chip 1. The ion source material 3 is loaded in the inner crucible 12. The series combination of the ion accelerating power supply 6 and electron accelerating power supply 10 acts as an ion extracting power supply for applying a high voltage between the ion extracting electrode 4 and emitter chip 1. The material for the emitter chip 1 is determined on the basis of the work function, melting point and reactivity with the ion source material 3. In general, a combination of metals react strongly with each other, and a reaction product thus obtained (namely, a chemical compound) is lower in melting point than the element metal. Accordingly, metals are usually unsuitable for the emitter chip 1.

In the present embodiment, the emitter chip 1 is made of an insulating material which is low in reactivity, for example, one of oxide materials such as quartz, alumina ($Al_2O_3$) and sapphire, and the surface of the emitter chip 1 is previously coated with a material having a large work function, for example, tungsten or tantalum. The cone-shaped inner crucible 12 has a sharper apex than the outer crucible, protrudes from the aperture of the outer crucible, and supported thereat. The inner crucible preferably has low reactivity (with the ion source material), refractory property and small heat capacity (easiness for heating) and may be made of such metals as Ta, W, Nb, Zr and/or such non-metals as BN, C. Thus, the ion source material 3 loaded in the inner crucible 12 can be stably taken out in the form of an ion, and the emitter chip 1 is prevented from reacting with the ion source material 3. The above coating on the surface of the emitter chip 1 is provided to increase the ionization efficiency of the ion source material 3. Even when the coating has a thickness of less than 1000 Å, the ionization efficiency is sufficiently improved. In the case where the emitter chip 1 is made of an insulating material, the efficiency at which the ion source material 3 absorbs heat given by the electron bombardment, is far greater and therefore power comsumption is smaller, as compared with the case where the emitter chip 1 is made of a metal.

The outer crucible 7 may be made of insulating material in accordance with its object. In the case where a material having a high melting point is used as the ion source material 3, it is desirable to make the crucible 7 of such an insulating material of a low heat conductivity as quartz glass, since the heat loss due to thermal conduction can be reduced. Due to the existence of the outer crucible 7, the inner crucible 12 may be released from the requirement to have a low heat conductivity.

The operation principle of the present embodiment is as follows.

First, the ion source material 3 is loaded in the inner crucible 12, and the inner crucible 12 is disposed in the outer crucible 7 so as to protrude from the bottom aperture of the crucible 7 by several millimeters. In this state, an electron accelerating voltage is applied between one of the emitter chip 1 and the inner crucible 12 (which are brought to be equal in electric potential to each other by the molten ion source material) and the filament 2 which is nearly equal in electric potential to a control electrode 9, to bombard the tip of the emitter chip 1 or the inner crucible 12 with electrons emitted from the filament 2, thereby heating the inner crucible 12. When the inner crucible 12 is heated, the ion source material 3 is melted, and the molten ion source material 3 is supplied to the tip of the emitter chip 1. The semi-closed inner crucible 12 and the emitter chip 1 are so designed that the molten ion source material 3 is allowed to be supplied to the tip of the chip 1 and to evaporate only at a very small region which is a limited region of the tip of the emitter chip 1. Therefore, the loss of the ion source material due to evaporation is extremely small. Next, an ion extracting voltage is applied between the emitter chip 1 and ion extracting electrode 4, to take out an ion beam 5.

The present embodiment can emit $Au^+$, $Ti^+$ and $Zr^+$ ions each of which is the ion of a material having a high melting point, as well as $Cs^+$, $Cl^-$ and $As^+$ ions which are reactive ions, in a favorable manner. Further, the present embodiment can produce $As^-$, $As^+$, $P^-$, $P^+$ and $B^+$ ions from insulating materials $As_2SE_3$, $P_2O_5$ and $B_2O_3$ and can emit stable beams of these ions.

As has been explained in the foregoing, according to the present invention, various ion beams can be emitted safely and surely from a material having a high melting point, a reactive material, an insulating material and a noxious material which are not fitted to be used as the ion source material in a conventional ion source. Accordingly, a limited region (namely, a submicron region) of an Si or GaAs substrate can be implanted with the ion of one selected from the above materials. That is, an ion source according to the present invention will be very useful to develop an ultra large scale integrated circuit and a three-dimensional device.

We claim:

1. An ion source comprising:
an emitter chip having a sharp tip;
an ion source material holding part made of a material having a high melting point and provided with an aperture in a bottom wall, said emitter chip being disposed within said ion source material holding part in a coaxial manner so that said tip of said emitter chip passes through said aperture;
means for emitting an electron beam;
a power supply for heating said electron beam emitting means;
an extraction electrode adapted to form an electric field for extracting an ion beam, around said tip of said emitter chip;
an ion extracting power supply for applying a high voltage between said extraction electrode and said emitter chip; and
an ion source material reservoir placed inside the ion source material holding part and being electrically conductive and adapted to be electrically connected to the emitter chip, the ion source material reservoir and the emitter chip forming a space for loading an ion source material and forming a slit for feeding a molten ion source material to the tip of the emitter chip.

2. An ion source according to claim 1, wherein said electron beam emitting means is made nearly equal in electric potential to said extraction electrode and is disposed in the vicinity of said extraction electrode so that an electron beam emitted from said electron beam emitting means is accelerated by said ion extracting field in a direction toward said tip of said emitter chip, to bombard said tip of said emitter chip and said ion source material reservoir with said electron beam, thereby heating said tip of said emitter chip and said ion source material reservoir.

3. An ion source according to claim 1, further comprising a control electrode adapted to controllably bombard said emitter chip with an electron beam emitted from said electron beam emitting means.

4. An ion source according to claim 1, wherein said emitter chip is at least partially held in said ion source material holding part, and said electron beam emitting means being disposed around said ion source material reservoir.

5. An ion source according to claim 4, further comprising a control electrode disposed around said tip of said emitter chip for being applied with an electric potential nearly equal to that of said electron beam emitting means so that an electron beam emitted from said electron beam emitting means is accelerated in a direction toward said top of said emitter chip and said ion source material reservoir, to bombard said top of said emitter chip and said ion source material reservoir with said electron beam, thereby heating said tip of said emitter chip and said ion source material reservoir.

6. An ion source according to claim 4, further comprising a control electrode adapted to controllably bombard said emitter chip and said ion source reservoir with an electron beam emitted from said electron beam emitting means.

7. An ion source according to claim 4, further comprising a lid inserted into said ion source material holding part so as to be placed on said ion source material reservior, thereby reducing the evaporation of said ion source material.

8. An ion source according to claim 5, further comprising a lid inserted into said ion source material holding part so as to be placed on said ion source material reservoir, thereby reducing the evaporation of said ion source material.

9. An ion source according to claim 6, further comprising a lid inserted into said ion source material holding part so as to be placed on said ion source material reservoir, thereby reducing the evaporation of said ion source material.

10. An ion source structure comprising:
a rod-shaped emitter chip being electrically conductive and having a sharp tip;
an outer crucible disposed around and being coaxial with the emitter chip, the outer crucible having a converging portion and an aperture at the end of said converging portion to pass the tip of said emitter chip; and
an inner crucible having a converging portion, disposed around and coaxial with the emitter chip and inside the outer crucible and protruding from said aperture of the outer crucible with said tip of the emitter chip further protruding from the inner crucible, the inner crucible being electrically conductive and adapted to be electrically connected to said emitter chip, the inner crucible and the emitter chip forming a space for loading an ion source material and forming a slit for feeding a molten ion source material to the tip of the emitter chip.

11. An ion source structure according to claim 10, wherein the inner crucible has a cone-shape.

12. An ion source structure according to claim 10, wherein the rod-shaped emitter chip has a constricted portion therealong for increasing heat resistance of the emitter chip.

13. An ion source structure according to claim 10, wherein the outer crucible is formed of an insulating material having a heat insulative property.

14. An ion source structure according to claim 13, wherein the insulating material is one of boron nitride and quartz glass.

15. An ion source structure according to claim 10, wherein the emitter chip is formed of a material of low reactivity coated with a material having a large work function.

16. An ion source structure according to claim 15, wherein the material of low reactivity is one of quartz, alumina and sapphire, and the material of large work function is one of tungsten, and tantalum.

17. An ion source structure according to claim 10, wherein the converging portion of the inner crucible has a sharper apex than the converging portion of the outer crucible.

18. An ion source structure according to claim 10, wherein the inner crucible has low reactivity and small heat capacity.

19. An ion source structure according to claim 10, wherein the inner crucible is made of a material selected from Ta, W, Nb, Zr, BN and C.

20. An ion source structure according to claim 10, wherein the inner crucible is adapted to be electrically connected to the emitter chip when an ion source material loaded in the inner crucible becomes molten.

* * * * *